(12) United States Patent
Chen et al.

(10) Patent No.: US 9,646,894 B2
(45) Date of Patent: May 9, 2017

(54) PACKAGING MECHANISMS FOR DIES WITH DIFFERENT SIZES OF CONNECTORS

(71) Applicant: Taiwan Semiconductor Manufacturing Company, Ltd., Hsin-Chu (TW)

(72) Inventors: Chih-Hua Chen, Zhubei (TW); Chen-Shien Chen, Zhubei (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 256 days.

(21) Appl. No.: 13/922,023

(22) Filed: Jun. 19, 2013

(65) Prior Publication Data
US 2014/0264769 A1 Sep. 18, 2014

Related U.S. Application Data

(60) Provisional application No. 61/798,136, filed on Mar. 15, 2013.

(51) Int. Cl.
*H01L 23/02* (2006.01)
*H01L 21/66* (2006.01)
(Continued)

(52) U.S. Cl.
CPC ............. *H01L 22/14* (2013.01); *H01L 23/13* (2013.01); *H01L 23/49805* (2013.01); *H01L 23/49811* (2013.01); *H01L 23/49822* (2013.01); *H01L 23/49827* (2013.01); *H01L 23/49833* (2013.01); *H01L 24/14* (2013.01); *H01L 25/0655* (2013.01); *H01L 25/50* (2013.01); *H01L 23/49816* (2013.01); *H01L 23/64* (2013.01); *H01L 25/105* (2013.01); *H01L 25/16* (2013.01); *H01L 25/18* (2013.01); *H01L 2224/131* (2013.01); *H01L 2224/13005* (2013.01); *H01L 2224/1403* (2013.01); *H01L 2224/16145* (2013.01); *H01L 2224/16238* (2013.01); *H01L 2224/81815* (2013.01); *H01L 2924/12042* (2013.01); *H01L 2924/1305* (2013.01);
(Continued)

(58) Field of Classification Search
CPC .............................. H01L 22/30; H01L 22/21
USPC ............................................. 257/48; 438/15
See application file for complete search history.

(56) References Cited

U.S. PATENT DOCUMENTS 4,811,082 A 3/1989 Jacobs et al.
4,990,462 A 2/1991 Sliwa, Jr.
(Continued)

FOREIGN PATENT DOCUMENTS

DE 3705828 10/1987
DE 10110203 A1 9/2002
(Continued)

*Primary Examiner* — Telly Green
(74) *Attorney, Agent, or Firm* — Slater Matsil, LLP

(57) ABSTRACT

Embodiments of mechanisms for forming a die package with multiple packaged dies on a package substrate use an interconnect substrate to provide electrical connections between dies and the package substrate. The usage of the interconnect substrate enables cost reduction because it is cheaper to make than an interposer with through silicon vias (TSVs). The interconnect substrate also enables dies with different sizes of bump structures to be packaged in the same die package.

20 Claims, 14 Drawing Sheets

(51) Int. Cl.
*H01L 23/498* (2006.01)
*H01L 23/00* (2006.01)
*H01L 23/13* (2006.01)
*H01L 25/065* (2006.01)
*H01L 25/00* (2006.01)
*H01L 23/64* (2006.01)
*H01L 25/10* (2006.01)
*H01L 25/16* (2006.01)
*H01L 25/18* (2006.01)

(52) U.S. Cl.
CPC ............ *H01L 2924/13091* (2013.01); *H01L 2924/15192* (2013.01); *H01L 2924/181* (2013.01); *H01L 2924/19107* (2013.01)

(56) References Cited

U.S. PATENT DOCUMENTS

| | | | |
|---|---|---|---|
| 5,075,253 A | 12/1991 | Sliwa, Jr. |
| 5,380,681 A | 1/1995 | Hsu |
| 5,447,264 A | 9/1995 | Koopman et al. |
| 5,481,133 A | 1/1996 | Hsu |
| 5,929,521 A | 7/1999 | Wark et al. |
| 6,001,493 A | 12/1999 | Rutledge et al. |
| 6,002,177 A | 12/1999 | Gaynes et al. |
| 6,187,678 B1 | 2/2001 | Gaynes et al. |
| 6,220,499 B1 | 4/2001 | Brofman et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,894,378 B2 | 5/2005 | Winderl |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 * | 7/2008 | Condorelli ......... H01L 23/5383 257/665 |
| 7,402,515 B2 | 7/2008 | Arana et al. |
| 7,402,901 B2 | 7/2008 | Hatano et al. |
| 7,410,884 B2 | 8/2008 | Ramanathan et al. |
| 7,432,592 B2 | 10/2008 | Shi et al. |
| 7,462,511 B2 | 12/2008 | Yamagata |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 7,915,741 B2 | 3/2011 | Lau et al. |
| 8,227,904 B2 | 7/2012 | Braunisch et al. |
| 8,817,511 B2 | 8/2014 | McCarthy et al. |
| 2002/0063319 A1 * | 5/2002 | Huang ................ H01L 21/563 257/678 |
| 2003/0230805 A1 | 12/2003 | Noma et al. |
| 2006/0267188 A1 | 11/2006 | Ishino et al. |
| 2007/0013063 A1 | 1/2007 | Khandekar et al. |
| 2007/0080442 A1 | 4/2007 | Meyer-Berg |
| 2008/0057837 A1 | 3/2008 | Shiratani et al. |
| 2008/0315409 A1 | 12/2008 | Cordes et al. |
| 2009/0278263 A1 | 11/2009 | McCarthy et al. |
| 2010/0072601 A1 * | 3/2010 | Tanaka ................ H01L 23/13 257/686 |
| 2010/0213608 A1 | 8/2010 | Lau et al. |
| 2010/0244024 A1 | 9/2010 | Do et al. |
| 2011/0068465 A1 | 3/2011 | Shen et al. |
| 2011/0092064 A1 | 4/2011 | Liu et al. |
| 2011/0101527 A1 * | 5/2011 | Cheng ................... H01L 24/11 257/738 |
| 2013/0134582 A1 | 5/2013 | Yu et al. |
| 2013/0168848 A1 | 7/2013 | Lin et al. |
| 2013/0168854 A1 * | 7/2013 | Karikalan ......... H01L 23/49833 257/738 |
| 2014/0048928 A1 * | 2/2014 | Li .......................... H01L 23/36 257/737 |
| 2014/0252561 A1 * | 9/2014 | Lisk ..................... H01L 23/5384 257/621 |
| 2014/0264337 A1 | 9/2014 | Chen et al. |

FOREIGN PATENT DOCUMENTS

| | | |
|---|---|---|
| DE | 112007002587 | 9/2009 |
| WO | 2008057837 | 5/2008 |

\* cited by examiner

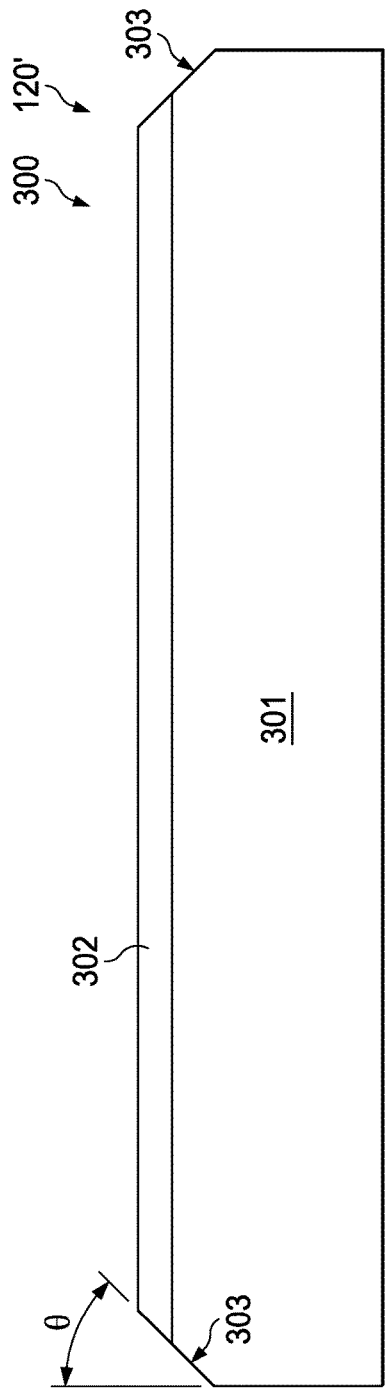
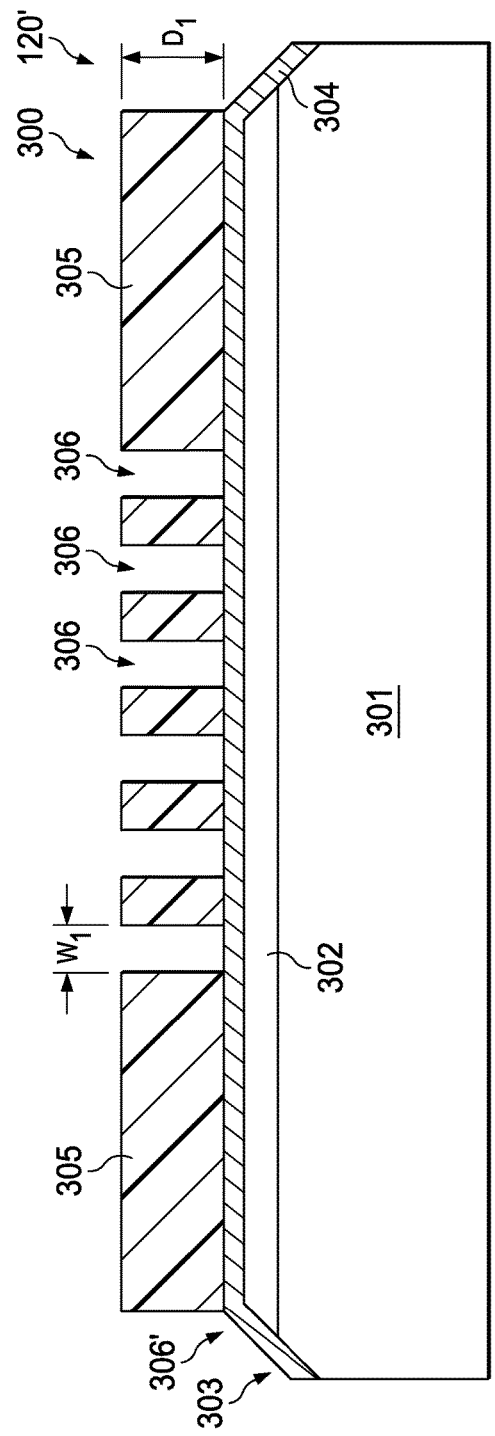

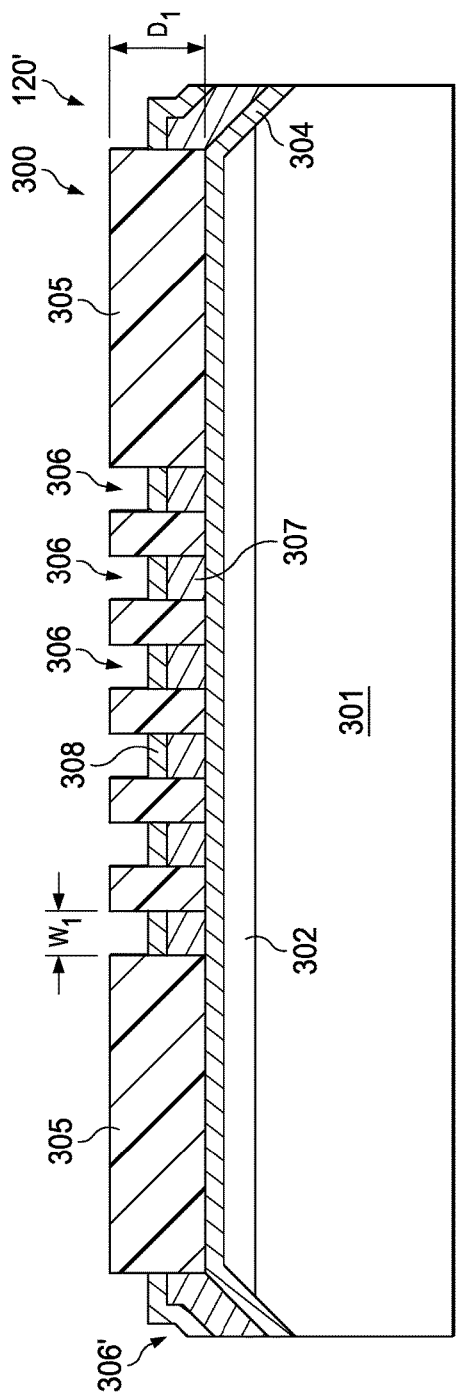
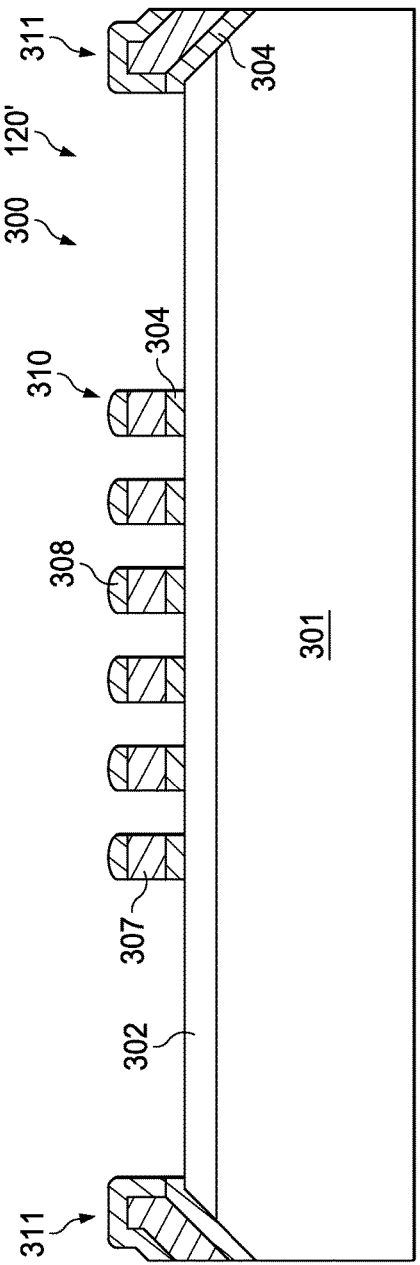
FIG. 3C
FIG. 3D

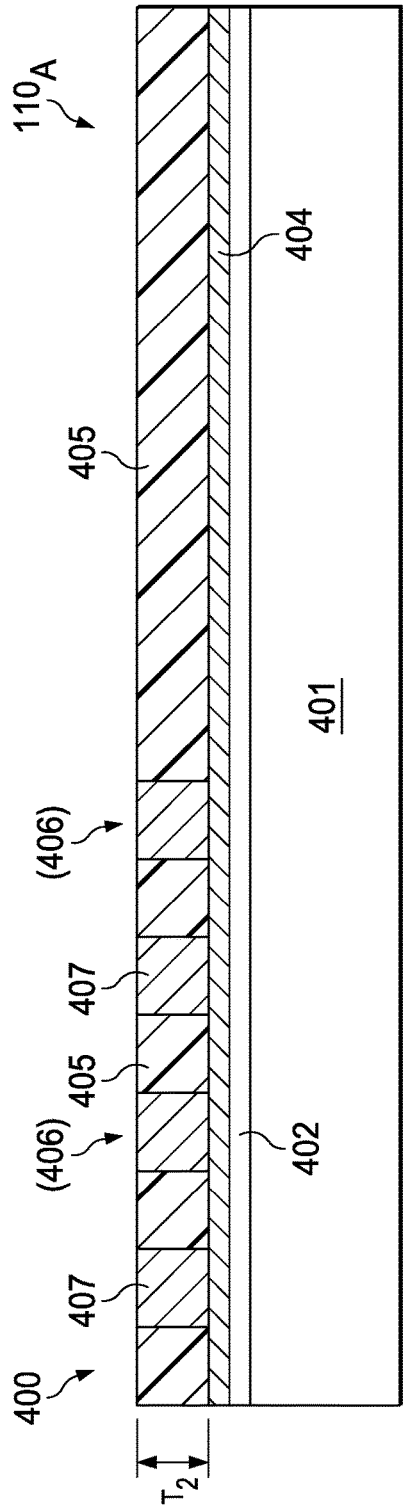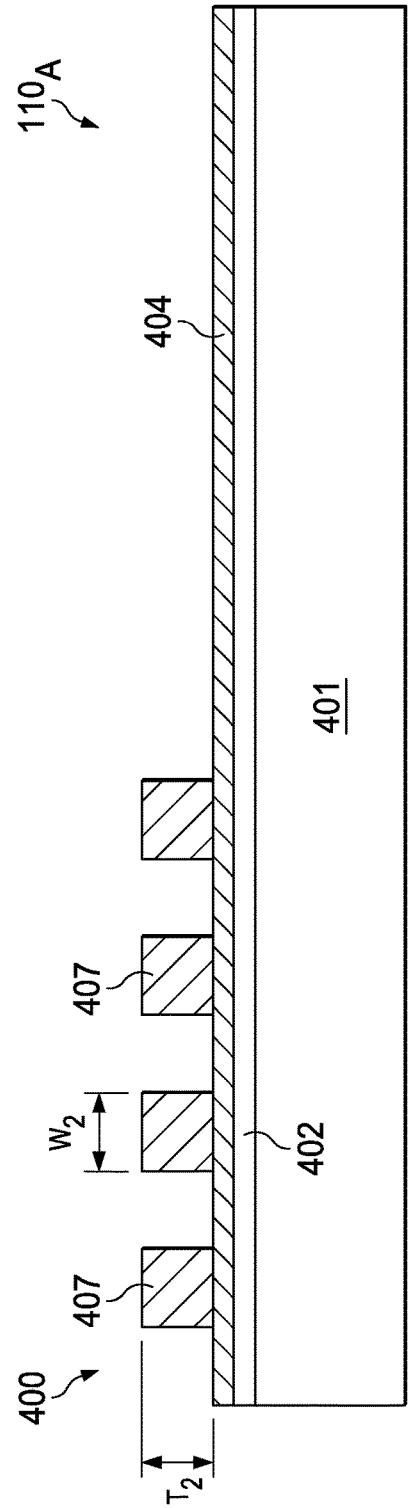
FIG. 4B
FIG. 4C

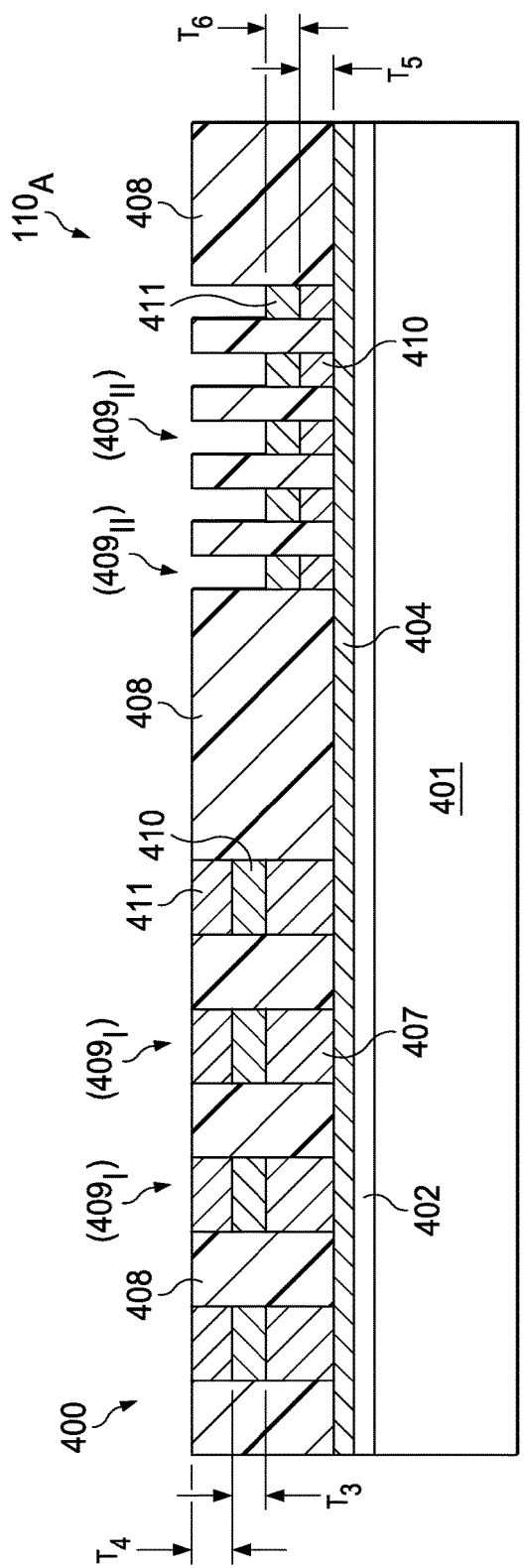
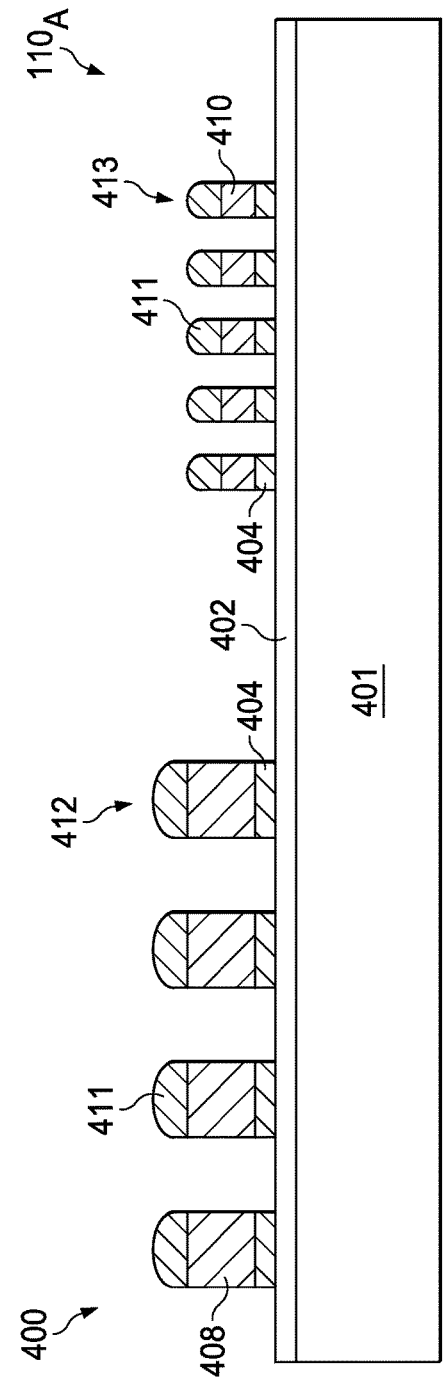
FIG. 4D
FIG. 4E

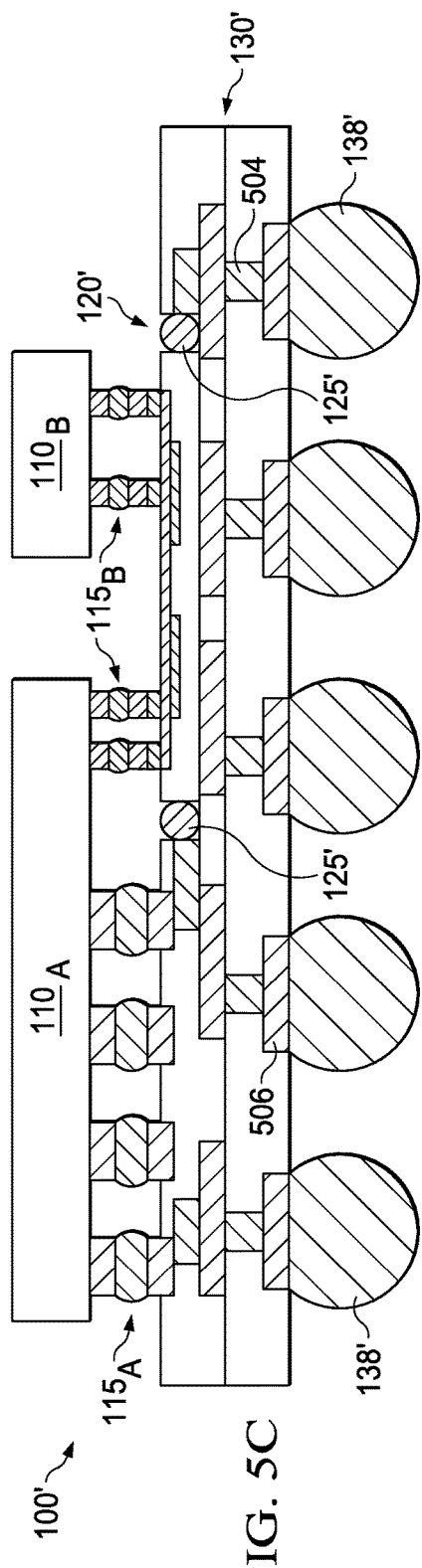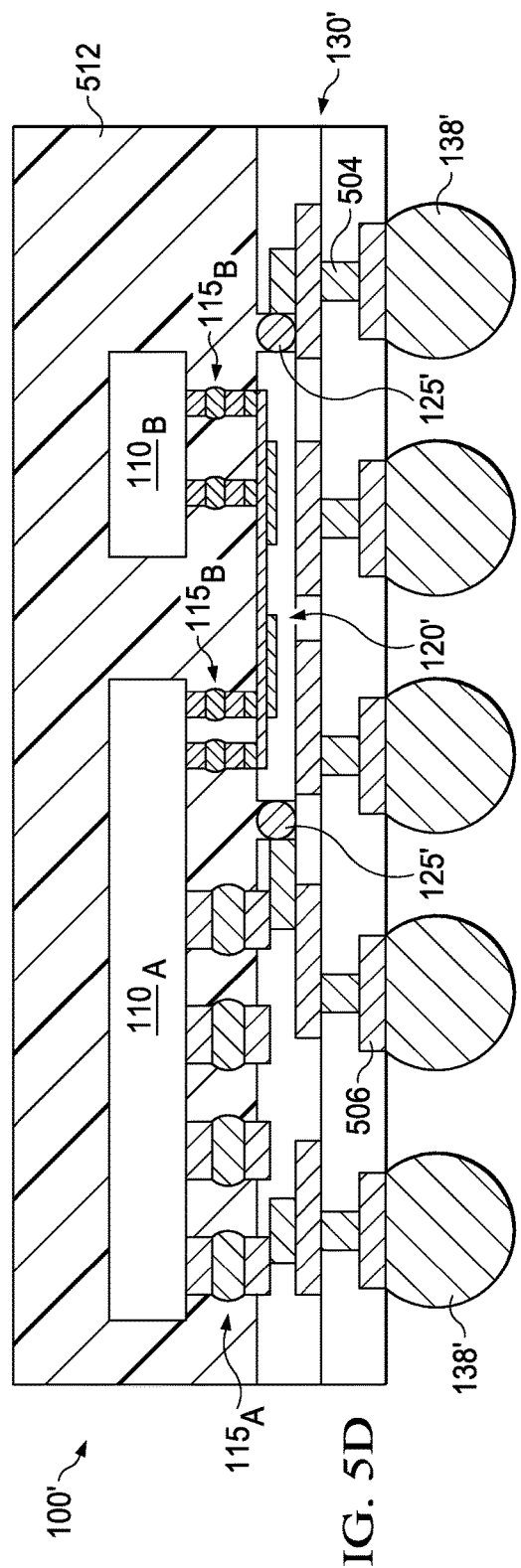

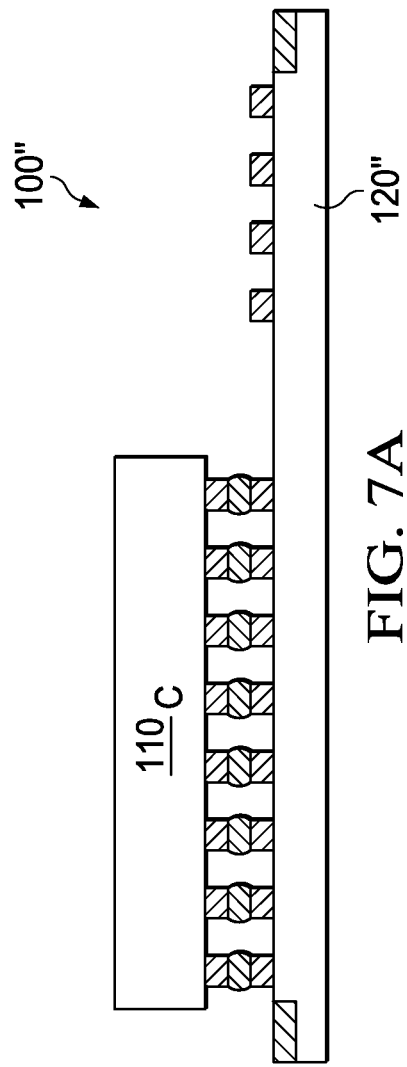
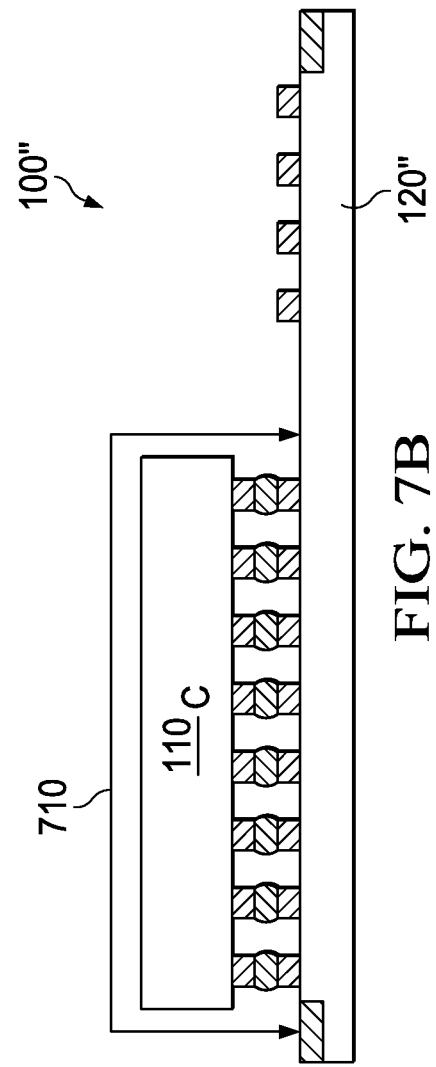

PACKAGING MECHANISMS FOR DIES WITH DIFFERENT SIZES OF CONNECTORS

This application claims priority to U.S. Provisional Application Ser. No. 61/798,136, filed on Mar. 15, 2013, entitled "Method and Apparatus for Package Structure," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies have begun to be developed. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3A-3E illustrate cross-sectional views of a sequential flow of forming an interconnect substrate, in accordance with some embodiments.

FIGS. 4A-4E illustrate cross-sectional views of a sequential flow of forming packaged die, in accordance with some embodiments.

FIGS. 5A-5D illustrate cross-sectional views of a sequential flow of forming die package, in accordance with some embodiments.

FIGS. 7A-7E illustrate cross-sectional views of a sequential flow of forming die package, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

Figure 1:
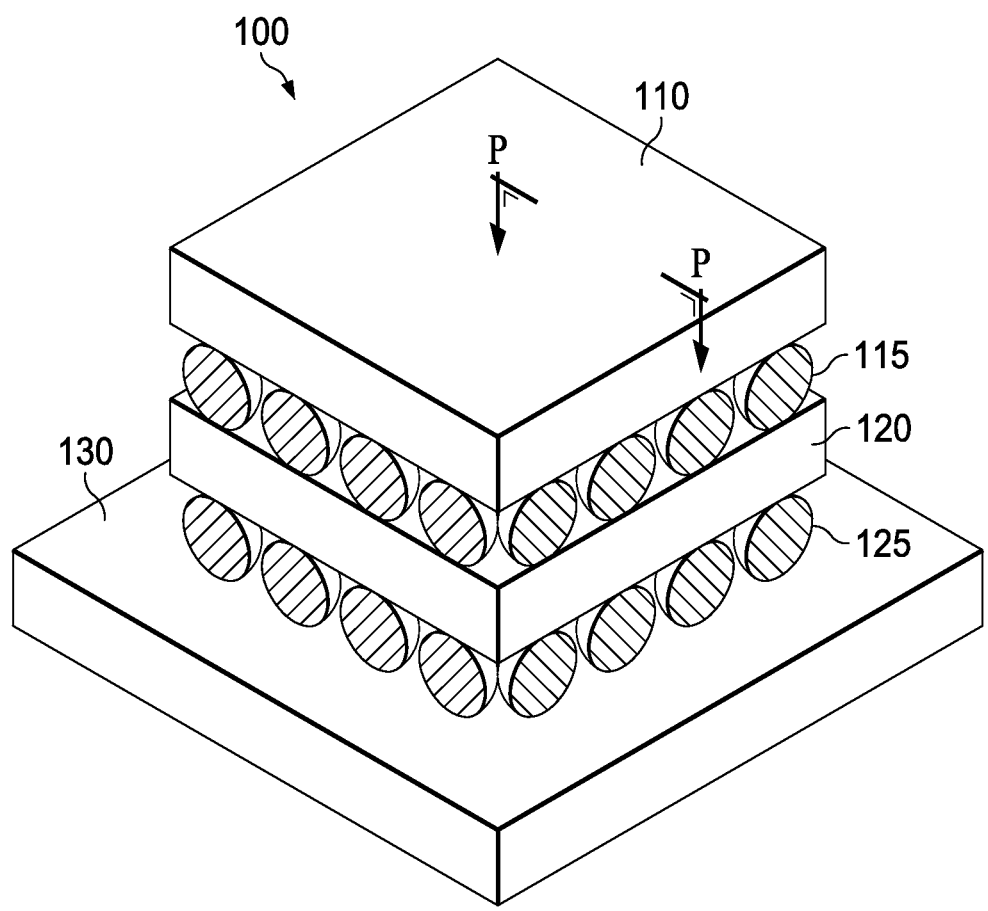
FIG. 1 is a perspective view of a die package, in accordance with some embodiments.

FIG. 1 is a perspective view of a die package 100 including a packaged die 110 bonded to an interconnect structure 120, which is further bonded to a substrate (or package substrate 3) 130 in accordance with some embodiments. Two or more packaged dies can be bonded to the interconnect structure 120. The two or more packaged dies could be different from one another. However, two or more of the packaged dies bonded to the interconnect structure 120 could be identical. For example, two identical packaged memory dies and a packaged processing-unit die, such as central processing unit (CPU) or graphic processing unit (GPU), could be bonded to interconnect structure 120.

Each packaged die, such as packaged die 110 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Interconnect substrate 120 may be made of a semiconductor wafer, or a portion of wafer. In some embodiments, interconnect substrate 120 includes silicon, gallium arsenide, silicon on insulator ("SOI") or other similar materials. Interconnect substrate 120 include interconnect structures or redistribution layer(s) (RDL) (not shown) to electrically connect packaged die 110 and substrate 130. RDLs are interconnect structures near the surface of die packages or on packaging structures to facilitate electrical connections. In some embodiments, interconnect substrate 120 also includes passive devices such as resistors, capacitors, inductors and the like, or active devices such as transistors. In some embodiments, substrate 130 includes additional integrated circuits. Interconnect substrate 120 may further include through substrate vias (TSVs) and may be an interposer. In addition, the interconnect substrate 120 may be made of other materials. In some embodiments, interconnect substrate 120 also includes bismaleimide triazine (BT) resin, FR-4 (a composite material composed of woven fiberglass cloth with an epoxy resin binder that is flame resistant), ceramic, glass, plastic, glass-fiber, silicon/glass interposer or other supporting materials that may carry the conductive pads or lands needed to receive conductive terminals.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Packaged die 110 is bonded to interconnect substrate 120 via connectors 115, and interconnect substrate 120 is bonded to substrate 130 via connectors 125. If two or more packaged dies, such as packaged die 110 and other packaged die(s), with different sizes of connectors are bonded to interconnect substrate 120, the packaging mechanisms could be challenging. Further, the cost of manufacturing the die package, such as die package 100, also needs to be taken into consideration. Interconnect substrates 120 with TSVs, which are also called interposers, provide functions for electrical connection and heat dissipation. However, interposers are expensive. For some applications that require low-cost die packages, alternative die package structures and methods for forming them are needed.

Figure 2A:
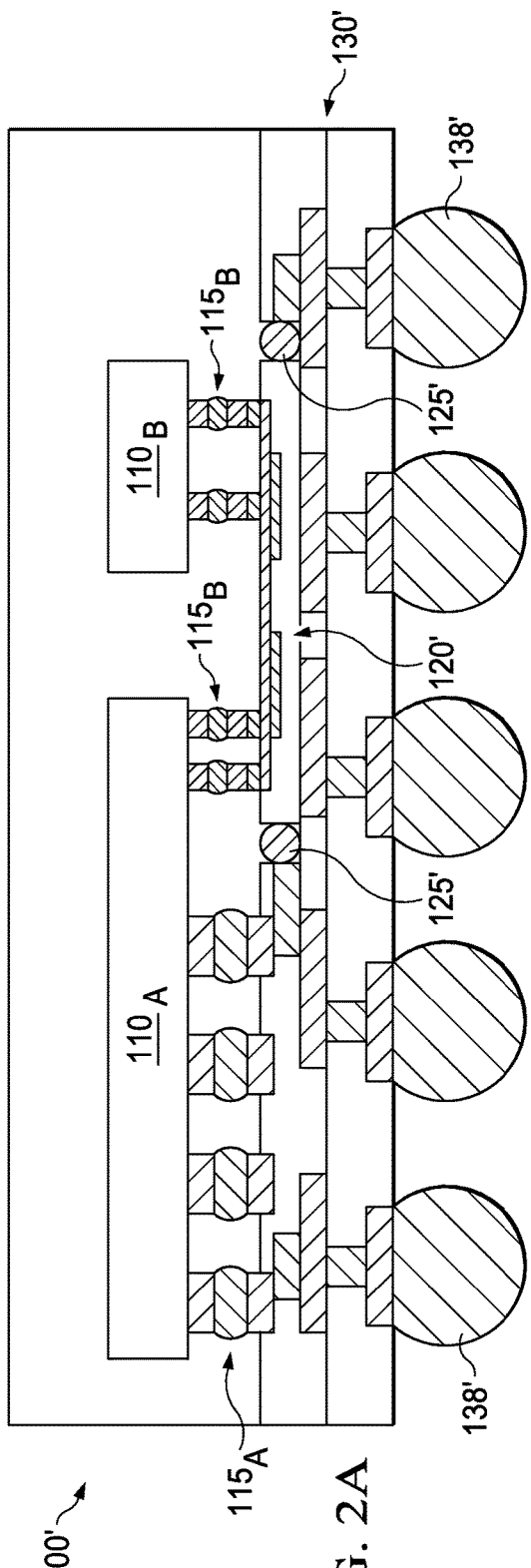
FIG. 2A shows a cross-sectional view of a die package, in accordance with some embodiments.

FIG. 2A shows a cross-sectional view of a die package 100', in accordance with some embodiments. Die package 100' includes a packaged die 110$_A$ and a packaged die 110$_B$. For example, packaged die 110$_A$ could be a central processing unit (CPU) or graphic control unit (GPU), and packaged die 110B could be a memory device, such as static random-access memory (SRAM) dynamic random-access memory (DRAM), or other types of memory devices. Packaged die 110$_B$ could have a large number of inputs/outputs (I/Os). As a result, the external connectors for packaged die 110$_B$ are small bumps, such as micro-bumps (μ-bumps). Packaged die 110$_A$ has connectors with different sizes. FIG. 2A shows packaged die 110$_A$ has large connectors and small connectors. The small connectors are about the same size as the connectors of packaged die 110$_B$. The large connectors of packaged die 110$_A$ are bonded directly to substrate (or package substrate) 130' to form bonding structures 115$_A$. The small connectors of packaged die 110$_A$ and packaged die 110$_B$ are bonded to an interconnect substrate 120' to form bonding structures 115$_B$. The interconnect substrate 120' is electrically connected to interconnect structure 135 of substrate 130' via connectors 125'. FIG. 2A also shows external connectors 138' bonded to substrate 130'.

Figure 2B:
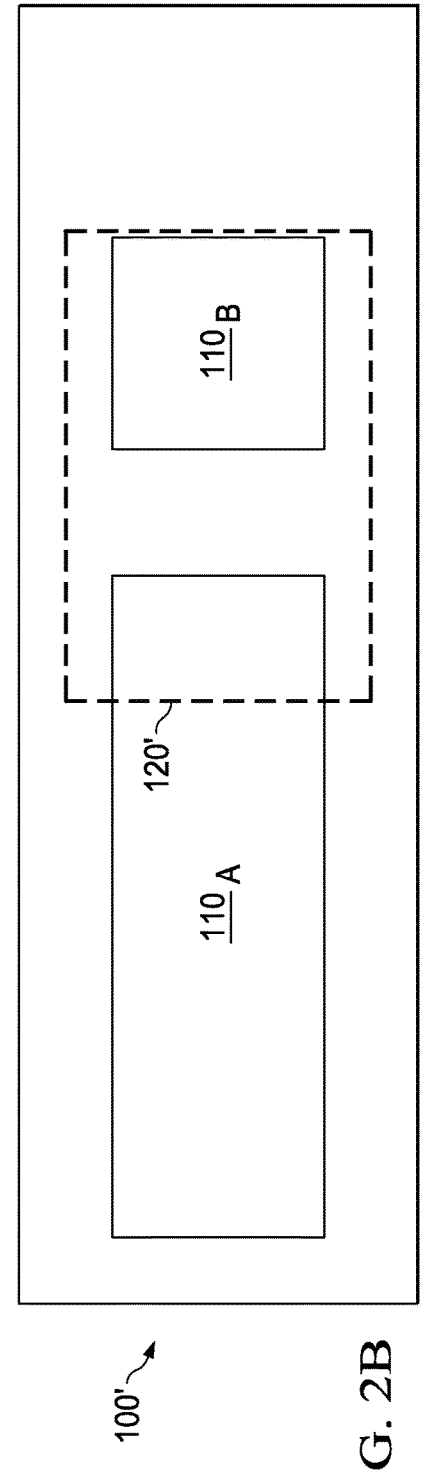
FIG. 2B shows a top view of die package of FIG. 2A, in accordance with some embodiments.

FIG. 2B shows a top view of die package 100' of FIG. 2A, in accordance with some embodiments. FIG. 2B shows that packaged die 110$_A$ is placed next to packaged die 110$_B$. Interconnect substrate 120' is disposed below packaged die 110$_B$ and a portion of packaged die 110$_A$. The bonding scheme shown in FIG. 2A does not involve a substrate with TSVs, whose manufacturing cost is high. As a result, the scheme in FIG. 2A saves manufacturing cost. Embodiments of mechanisms for forming die package 100' are described below.

Figure 3E:
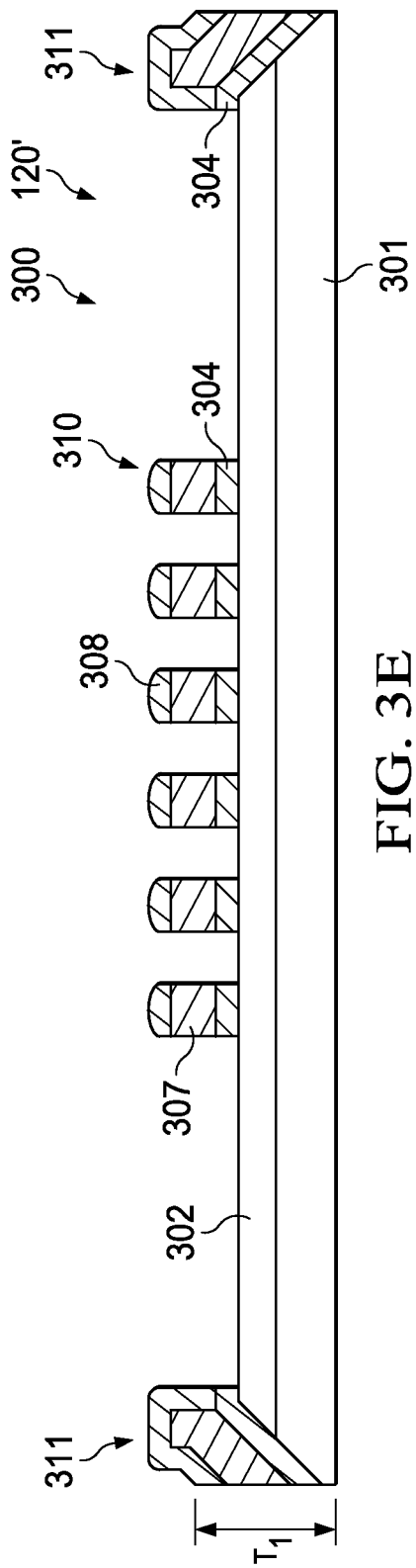

FIGS. 3A-3E illustrate cross-sectional views of a sequential flow of forming interconnect substrate 120', in accordance with some embodiments. FIG. 3A shows a redistribution structure 302 formed over a substrate 301. As mentioned above, the substrate 301 for interconnect substrate 120' may be made of a semiconductor wafer, glass, or other applicable materials. In some embodiments, substrate 301 includes silicon, gallium arsenide, silicon on insulator ("SOI"), glass or other similar materials. FIGS. 3A-3E only show a region 300 of a single interconnect substrate 120'. During processing, a number of interconnect substrate 120' are formed on substrate 301. At the end of the processing sequence, substrate 301 is sawed to separate into individual interconnect substrate 120'. Interconnect substrate 120' does not contain active devices, such as transistors, memory devices, etc. and does not contain passive devices, such as resistors or capacitors, in some embodiments. As a result, the manufacturing cost of interconnect substrate 120' is relative low and lower than interposer with TSVs. In some embodiments, interconnect substrate 120' contains passive devices. Even if the interconnect substrate 120' contains passive devices, the manufacturing cost of interconnect substrate 120' is still much lower than an interposer substrate with TSVs.

FIGS. 3A-3E show region 300 of interconnect substrate 120', in accordance with some embodiments. During processing, the substrate 301 includes a number of regions similar to region 300 for forming additional interconnect substrates 120'. The redistribution structure 302 includes one or more redistribution layers (RDLs) (not shown), which are insulated by passivation layers. Examples of redistribution structures and bonding structures, and methods of forming them are described in U.S. application Ser. No. 13/427,753, entitled "Bump Structures for Multi-Chip Packaging," filed on Mar. 22, 2012 U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

FIG. 3A also shows that corners 303 are formed by removing portions of substrate 301. In some embodiments, corners 303 are removed by laser (a laser-grooving process), which removes trenches in substrate 301. Other material-removal process may also be used. Region 300 includes corners 303, which are half of the trenches. FIG. 3A shows that each of corners 303 has a slanted sidewall. In some embodiments, the angle, θ, between the slanted sidewall and a normal to the substrate surface is in a range from about 30 degrees to about 60 degrees. Corners 303 can be formed before or after the formation of redistribution structure 302.

A plating seed layer 304 is then formed on redistribution structure 302 as shown in FIG. 3B in accordance with some embodiments. In some embodiments, the plating seed layer 304 is made of copper and is formed by physical vapor deposition (PVD). However, other conductive film may also be used. For example, the plating seed layer 304 may be made of Ti, Ti alloy, Cu, and/or Cu alloy. The Ti alloy and Cu alloy may include silver, chromium, nickel, tin, gold, tungsten, and combinations thereof. In some embodiments, the thickness of the plating seed layer 304 is in a range from about 0.1 μm to about 0.8 μm. In some embodiments, the plating seed layer 304 includes a diffusion barrier layer, which is formed prior to the deposition of the plating seed layer. The plating seed layer 304 may also act as an adhesion layer to under layer. In some embodiments, the diffusion barrier layer is made of Ti with a thickness in a range from about 0.03 μm to about 0.1 μm. However, the diffusion barrier layer may be made of other materials, such as TaN, or other applicable materials and the thickness range is not limited to the range described above. The diffusion barrier layer is formed by PVD in some embodiments.

After plating seed layer 304 is formed, a photoresist layer 305 is defined over it, as shown in FIG. 3B in accordance with some embodiments. The photoresist layer 305 may be formed by a wet process, such as a spin-on process, or by a dry process, such as by applying a dry film over the surface of the plating seed layer 304. After the photoresist layer 305 is formed, the photoresist layer 305 is patterned to formed openings 306, which are used form connectors (or bonding structures, such as bumps) for the single interconnect substrate 120'. FIG. 3B also shows that photoresist layer 305 is also removed near corners 303 to form exposed regions 306'. The patterning processes involved include photolithography and resist development. In some embodiments, the width $W_1$ of openings 306 is in a range from about 10 μm to about 60 μm. In some embodiments, the depth $D_1$ of openings 306 is in a range from about 15 μm to about 80 μm.

Afterwards, a conductive layer 307 is plated on the surface of exposed plating seed layer 304, such as over the surfaces in openings 306 and over surfaces of exposed regions 306' (over corners 303), in accordance with some embodiments. The conductive layer 307 is made of copper, copper alloy, or a combination thereof in some embodiments. Following the formation of the first conductive layer 307, a solder layer 308 is formed over conductive layer 307. In some embodiments, both the conductive layer 307 and solder layer 308 are formed by plating processes. FIG. 3C shows the conductive layer 307 and solder layer 308 after their formation, in accordance with some embodiments. In some embodiments, the thickness of conductive layer 307 in openings 306 is in a range from about 10 μm to about 30 μm. In some embodiments, the thickness of solder layer 308 in openings 306 is in a range from about 5 μm to about 30 μm.

The thickness of conductive layer 307 and solder layer 308 over exposed regions 306' are thicker than in openings 306 due to larger exposed surface area during plating processes. In some embodiments, the thickness of conductive layer 307 over exposed regions 306' is in a range from about 12 μm to about 40 μm. In some embodiments, the thickness of solder layer 308 over exposed regions 306' is in a range from about 5 μm to about 40 μm.

After the formation of the conductive layer 307 and solder layer 308, the photoresist layer 305 is removed, as shown in FIG. 3D in accordance with some embodiments. The removal process may involve dry or wet etching. An etch process is then performed to remove the plating seed layer 304 not covered by conductive layer 307 and solder layer 308.

After the photoresist layer 305 is removed and the etching of exposed plating seed layer 304, the conductive layer 307 and solder layer 308 in the openings 306 are exposed to form external connectors (or bump structures) 310. The exposed conductive layer 307 and solder layer 308 formed over the posed regions 306' form contact structures 311.

A reflow process is then conducted to reflow the solder layer 308 over the patterned conductive layer 307 to prepare external connectors 310 for bonding. The solder layer 308 covering the conductive layer 307 near over exposed regions 306' is also reflowed to cover side wall(s) of conductive layer 307, as shown in FIG. 3D in accordance with some embodiments.

Following the reflow process described above, substrate 301 is thinned down to a thickness $T_1$, as shown in FIG. 3E in some embodiments. The thinning process may apply a grinding process. In some embodiments, thickness $T_1$ is in a range from about 20 μm to about 50 μm. Following the thinning process, region 300 is singulated into individual piece from the entire substrate 301 for further packaging, to be described below. The singulation process is a sawing process, in accordance with some embodiments. In some embodiments, neighboring contact structures 311 of neighboring interconnect substrate 120' are connected to one another prior to singulation process and are separated from one another after the singulation process. A portion of each contact structure 311 is in the scribe line, which is the region for sawing blade to cut through, for such embodiments.

Figure 4A:
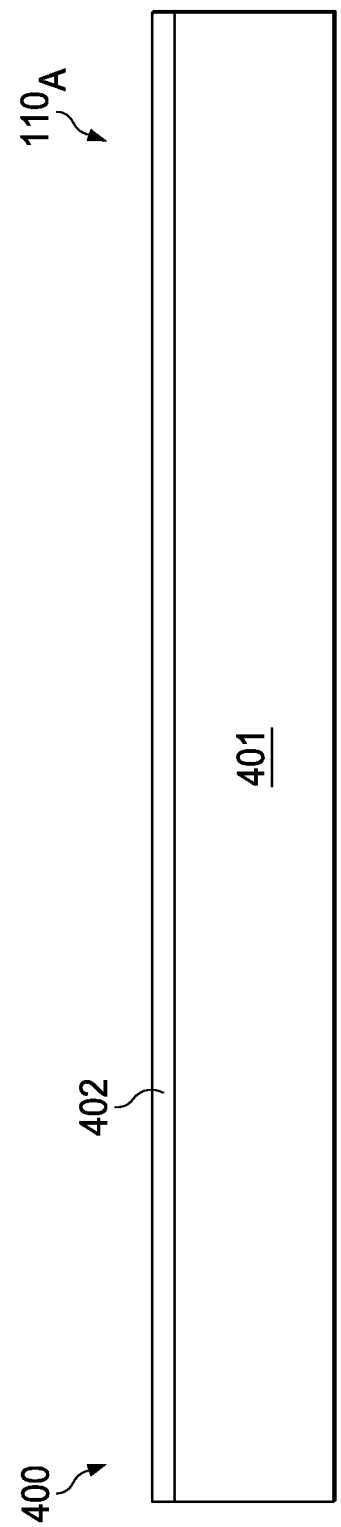

FIGS. 4A-4E illustrate cross-sectional views of a sequential flow of forming packaged die $110_A$, in accordance with some embodiments. FIG. 4A shows a redistribution structure 402 formed over a region 400 of substrate 401, which includes semiconductor devices (not shown), interconnect structures (not shown), and contact pads (not shown), which are formed over interconnect structures to make electrical connections with the semiconductor devices. The semiconductor devices may be active or passive. The interconnect structures may include metal layers and different layers of vias, which are used to connect metal layers. The conductive layers of the interconnect structures are insulated by dielectric layers. The redistribution structure 402 is formed over contact pads to make electrical connection to contact pads and semiconductor devices in substrate 401. FIGS. 4A-4E only show region 400 of a single die. During processing, a number of dies are formed on substrate 401. At the end of the processing sequence, substrate 401 is sawed to separate into individual packaged die $110_A$.

The redistribution structure 402 includes one or more redistribution layers (RDLs) (not shown), which are insulated by passivation layers. A plating seed layer 404 is then formed on redistribution structure 402 as shown in FIG. 4B in accordance with some embodiments. Plating seed layer 404 is similar to plating seed layer 304 described above. In some embodiments, the thickness of the plating seed layer 404 is in a range from about 0.1 μm to about 1.0 μm. In some embodiments, the plating seed layer 404 includes a diffusion barrier layer, which is formed prior to the deposition of the plating seed layer. The plating seed layer 304 may also act as an adhesion layer to under layer. In some embodiments, the diffusion barrier layer is made of Ti with a thickness in a range from about 0.01 μm to about 0.1 μm.

After plating seed layer 404 is formed, a photoresist layer 405 is deposited and patterned over it, as shown in FIG. 4B in accordance with some embodiments. The process of forming photoresist layer 405 is similar to the process of photoresist layer 305. The material used for forming photoresist layer 405 could also be similar to photoresist layer 305. Following the patterning of photoresist layer 405, a conductive layer 407 is plated on the surface of exposed plating seed layer 404, such as over the surfaces in openings (406). The conductive layer 407 is made of copper, copper alloy, or a combination thereof in some embodiments. Afterward the conductive layer 407 is deposited, the photoresist layer 405 is removed, as shown in FIG. 4C in accordance with some embodiments. The removal process may involve dry or wet etching. After the photoresist layer 405 is removed, the conductive layer 407 in the openings 406 is exposed. In some embodiments, the thickness $T_2$ of conductive layer 407 formed in openings 406 is in a range from about 20 μm to about 80 μm. In some embodiments, the width $W_2$ of conductive layer 407 formed in openings 406 is in a range from about 60 μm to about 300 μm.

After photoresist layer 405 is removed, a photoresist layer 408 is deposited and patterned over substrate 401, as shown in FIG. 4D in accordance with some embodiments. The process of forming photoresist layer 408 is similar to the process of photoresist layer 405. The material used for forming photoresist layer 408 could also be similar to photoresist layer 405. The patterns of the photoresist layer 408 include openings ($409_I$) and ($409_{II}$). FIG. 4D shows that the sizes of openings ($409_I$) are substantially the same as the sizes of structures of conductive layer 407 of FIG. 4C. The sizes of openings ($409_{II}$) are smaller than the sizes of openings ($409_I$) to form smaller connectors (or bump structures). In some embodiments, the width $W_3$ of openings ($409_{II}$) is in a range from about 50 μm to about 290 μm.

Following the patterning of photoresist layer 408, a conductive layer 410 and a solder layer 411 are plated on substrate 401 to fill at least portions openings ($409_I$) and ($409_{II}$), as shown in FIG. 4D. The conductive layer 410 is made of copper, copper alloy, or a combination thereof in some embodiments. The solder layer 411 is formed over the conductive layer 410. Due to difference in sizes of openings ($409_I$) and ($409_{II}$), the thicknesses of conductive layer 410 and solder layer 411 formed in these two types of openings are different. Plating process would grow thicker films in wider openings. In some embodiments, the thickness $T_3$ of conductive layer 410 formed in openings $409_I$ is in a range from about 10 μm to about 60 μm, and the thickness $T_4$ of solder layer 411 in openings $409_I$ is in a range from about 20 μm to about 40 μm. In some embodiments, the thickness $T_5$ of conductive layer 410 formed in openings $409_{II}$ is in a range from about 12 μm to about 40 μm, and the thickness $T_6$ of solder layer 411 in openings $409_{II}$ is in a range from about 5 μm to about 40 μm.

Afterward the solder layer 407 is deposited, the photoresist layer 408 is removed, as shown in FIG. 4F in accordance with some embodiments. The removal process may involve dry or wet etching. After the photoresist layer 408 is removed, an etch process is performed to remove plating seed layer 404 not covered by the conductive layers 407, 410, and solder layer 411. The conductive layer 407, conductive layer 410, and solder layer 411 in the openings ($409_I$) are exposed to form external connectors (or bump structures) 412. Similarly, the conductive layer 410 and solder layer 411 in openings ($409_{II}$) are also exposed to form connectors (or bump structures) 413. A reflow process is then performed to prepare the external connectors 412 and 413 for bonding. FIG. 4E shows the connectors 412 and 413 after the reflow process, in accordance with some embodiments.

Following the reflow process described above, region 400 is singulated into individual piece from the entire substrate 401 and becomes packaged die $110_A$, which is ready for further packaging. The singulation process is a sawing process, in accordance with some embodiments.

Packaged die $110_B$ have one-size external connectors, as shown in FIG. 2A. The process sequence for forming external connectors of packaged die $110_B$ can be extracted from the process flows described in FIGS. 3A-3E and FIGS. 4A-4E.

Figure 5A:
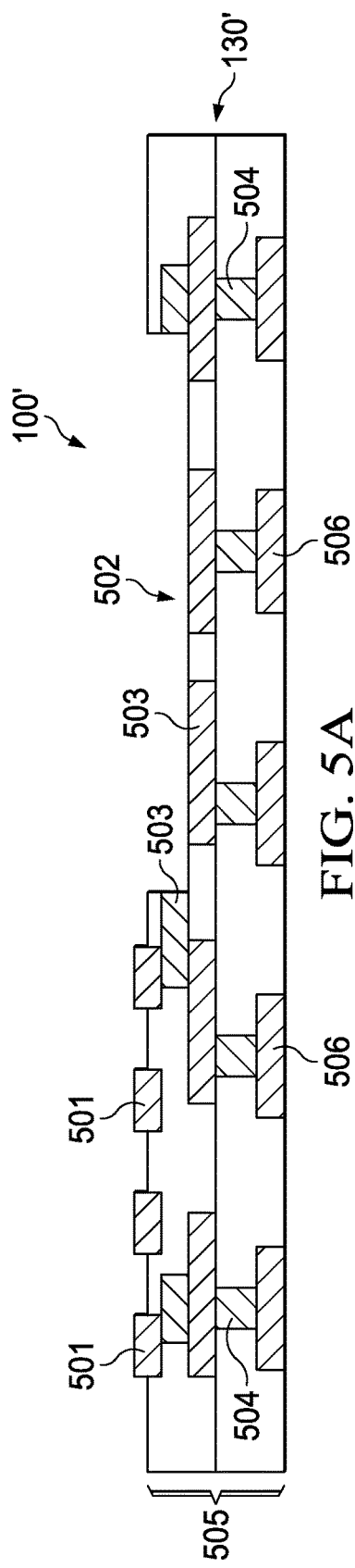

After interconnect substrates 120', packaged dies $110_A$, and packaged dies $110_B$ are prepared or provided, they are assembled on substrates 130'. FIGS. 5A-5D illustrate cross-sectional views of a sequential flow of forming die package 100', in accordance with some embodiments. FIG. 5A shows that a substrate 130' is provided. Substrate 130' is include a number of bonding structures 501, which are formed over interconnect structure 505. In some embodiments, bonding structures 501 are bonding pads. In some embodiments, there is a solder layer over the bonding pads on each of the bonding structures 501, which becomes called bump structures. Interconnect structure 505 includes conductive layers, such as metal layers 503, vias (not shown), and vias 504, such as plating through holes (PTHs), formed in dielectric material(s) in accordance with some embodiments. Vias 504 are electrically connected to bonding pads 506 on the other side substrate 130'. Connectors would be formed on bonding pads 506 at a later stage, which will be described below. In some embodiments, substrate 130' includes dielectric material(s) made of a composite material composed of woven fiberglass cloth with an epoxy resin binder that is flame resistant.

Figure 5B:
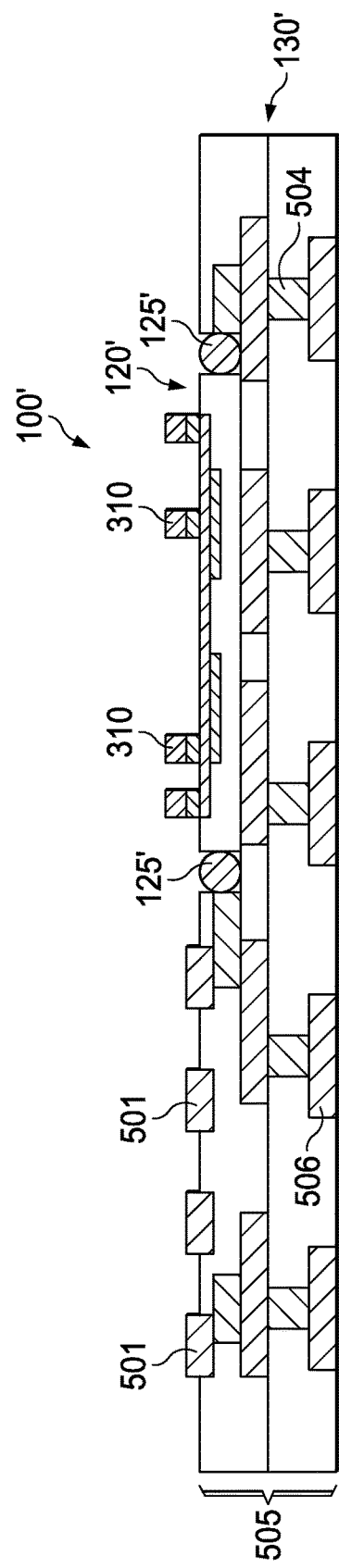

Substrate 130' also includes an opening 502 to house interconnect substrate 120'. FIG. 5B shows that the interconnect substrate 120' being placed in opening 502 and being connected to the interconnect structure 505 of substrate 130'. FIG. 5B shows that solder balls 125' are placed in a space between the interconnect structure 505 and substrate 130". Solder balls 125' are soldered to neighboring conductive structure of interconnect structure 505 and contact structures 311 of interconnect substrate 120' to physically and electrically connect interconnect structure 120' with substrate 130', in accordance with some embodiments.

After the interconnect substrate 120' is bonded to substrate 130', packaged dies $110_A$ and $110_B$ are bonded to interconnect substrate 120' and substrate 130', as shown in FIG. 5C in accordance with some embodiments. Either packaged die $110_A$ or packaged die $110_B$ can by bonded first. In addition, after one packaged die is bonded, an electrical test can be conducted to ensure the bonding of the packaged die is good before the other packaged die is bonded. For example, packaged die $110_A$ is picked and placed over substrate 130' to be bonded to bonding structures 501 to form bonded structures $115_A$ and a portion of external connectors (or bump structures) 310 of interconnect substrate 120' to form bonded structures $115_B$. The bonding process involves solder reflow. Afterwards, an electrical test is conducted to ensure the bonding of packaged die $110_A$ yields good results before packaged die $110_B$ is bonded to the remaining connectors 310 of interconnect structure 120', in some embodiments. The electrical test enables screening of poorly bonded packaged dies to prevent wasting additional resources, such as packaged dies $110_B$, known bad packaged structures.

After the electrical test is done, packaged die $110_B$ is bonded to the remaining connectors 310 of interconnect structure 120' to form bonded structures $115_B$, in some embodiments. However, the electrical test can be optional. In some embodiments, another electrical test is performed after packaged die $110_B$ is bonded. This other electrical test can check the quality of bonding of packaged die $110_B$ to reduce waste of resources. After both packaged dies $110_A$ and $110_B$ are bonded to substrate 130' and interconnect substrate 120', a molding compound 512 is applied over substrate 130' to cover packed dies $110_A$ and $110_B$ and to fill the space underneath packaged dies $110_A$ and $110_B$, a shown in FIG. 5D in accordance with some embodiments. In some embodiments, an underfill (not shown) is applied to fill the space under packaged dies 110A and 110B before molding compound 512 is applied. A thermal reflow process is performed to set the molding compound 512. If an underfill is applied, a thermal reflow process is also performed immediately afterwards to set the underfill.

After the molding compound 512 is formed, external connectors (such as solder balls) 138' are formed on bonding pads 506 to form die package 100', as shown in FIG. 5D in accordance with some embodiments. The process could involve turning substrate 130' upside down and placing substrate 130' on a glue layer (not shown) with molding compound 512 contacting the glue layer. After substrate 130' is secured to the glue layer, solder balls 138' are placed over bonding pads 506 and are bonded to bonding pads 506 by reflow. Die package 100' is then singulated to be separated from other did packages 100' of substrate 130'. FIG. 5D shows die package 100' in accordance with some embodiments.

Figure 6:
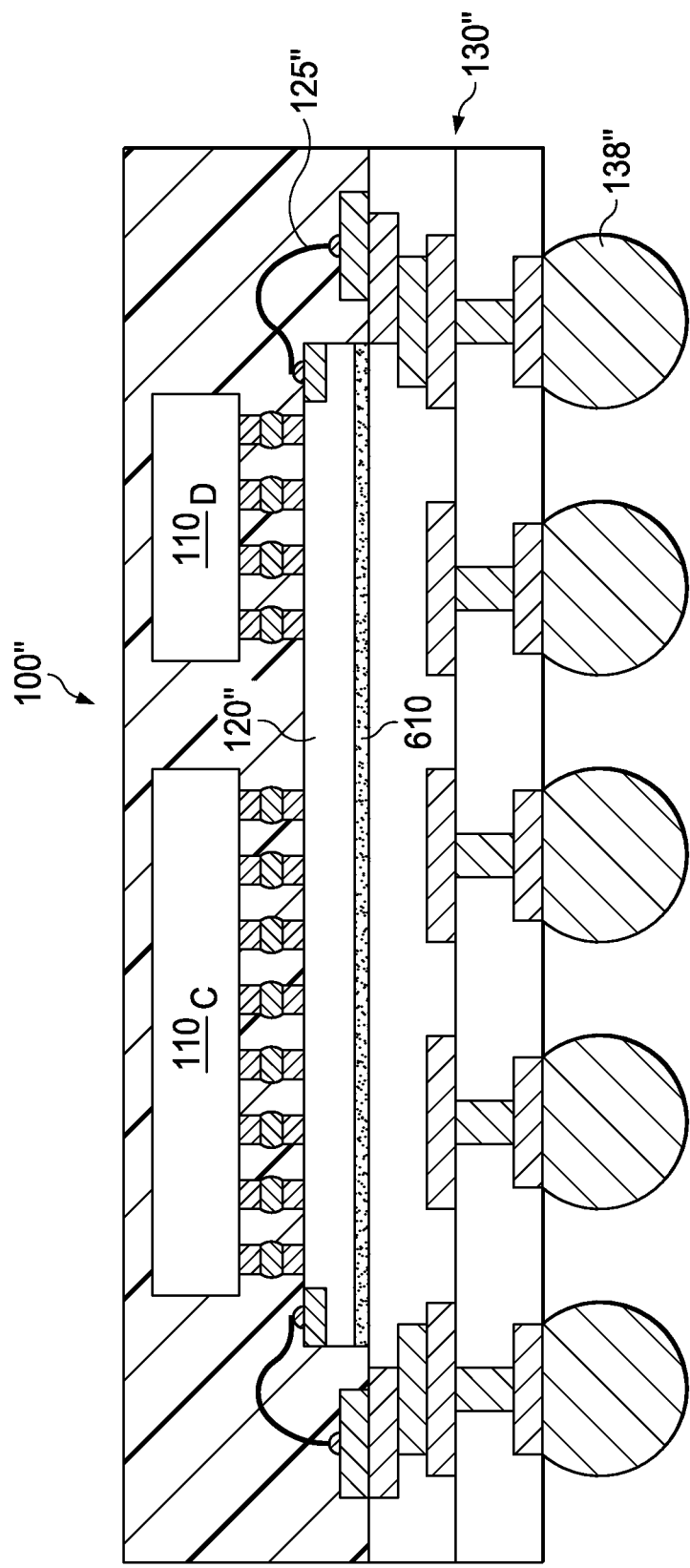
FIG. 6 shows a cross-sectional view of a die package, in accordance with some embodiments.

FIG. 6 shows a cross-sectional view of a die package 100", in accordance with some embodiments. Die package 100" includes a packaged die $110_C$ and a packaged die 110. Both packaged die $110_C$ and packaged die $110_d$ have large numbers of inputs/outputs (I/Os). As a result, the external connectors for them are small bumps, such as micro-bumps (μ-bumps). Both packaged dies $110_C$ and $110_D$ are bonded to an interconnect substrate 120" to form bonding structures 115". A glue layer 610 is used to adhere interconnect substrate 120" to substrate (or package substrate) 130". The interconnect substrate 120" is electrically connected to interconnect structure 135' of substrate 130' via connecting devices, such as wire bonds 125". Other types of connecting devices, such as solder balls 125' described above may also be used. An opening similar to opening 502 described above to house interconnect substrate 120" may also be formed to accommodate interconnect substrate 120". FIG. 6 also shows external connectors 138" bonded to substrate 130".

The formation mechanisms for interconnect substrate 120" are similar to those of interconnect substrate 120'. The formation mechanisms for packaged dies $110_C$ and $110_D$ are similar to the formation mechanisms of packaged die $110_B$ described above. Substrate 130" is similar to substrate 130'; however, the interconnect structures and bonding structures on substrate 130" could be arranged differently from substrate 130'.

Figure 7C:
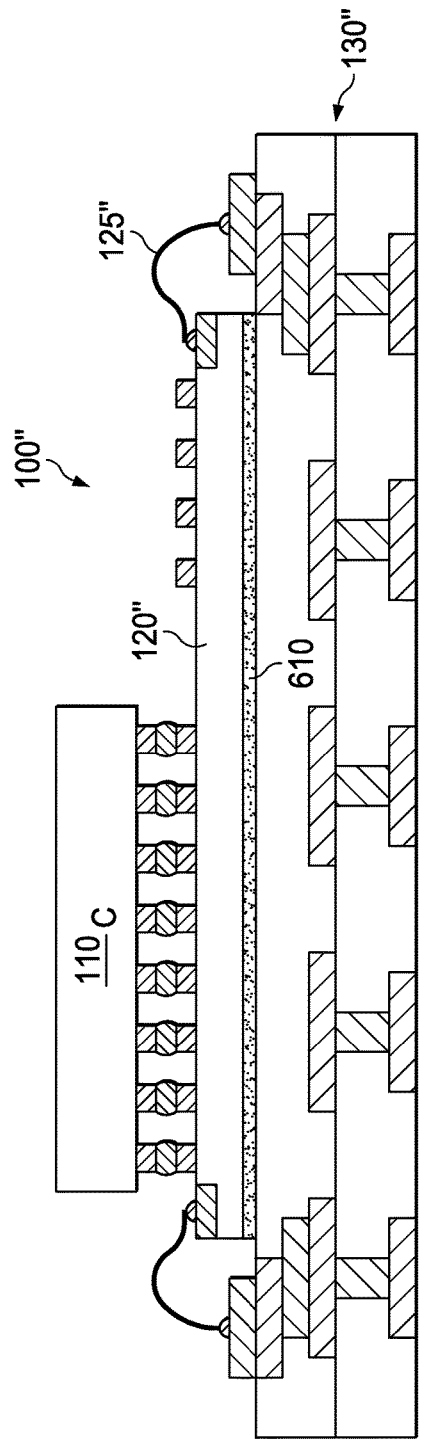

After interconnect substrate 120", packaged die $110_C$, and packaged die $110_D$ are prepared or provided, they are assembled on substrate 130". FIGS. 7A-7E illustrate cross-sectional views of a sequential flow of forming die package 100", in accordance with some embodiments. FIG. 7A shows a packaged die $110_C$ is picked and placed over a interconnect substrate 120" to be bonded to substrate 120". Packaged die $110_C$ is then bonded to interconnect substrate 120". Electrical testing (or probing) is then conducted to test the quality of bonding and to test the quality of packaged die $110_C$ by electrical probes 710, as shown in FIG. 7B in accordance with some embodiments. However, the electrical testing is optional.

Figure 7D:
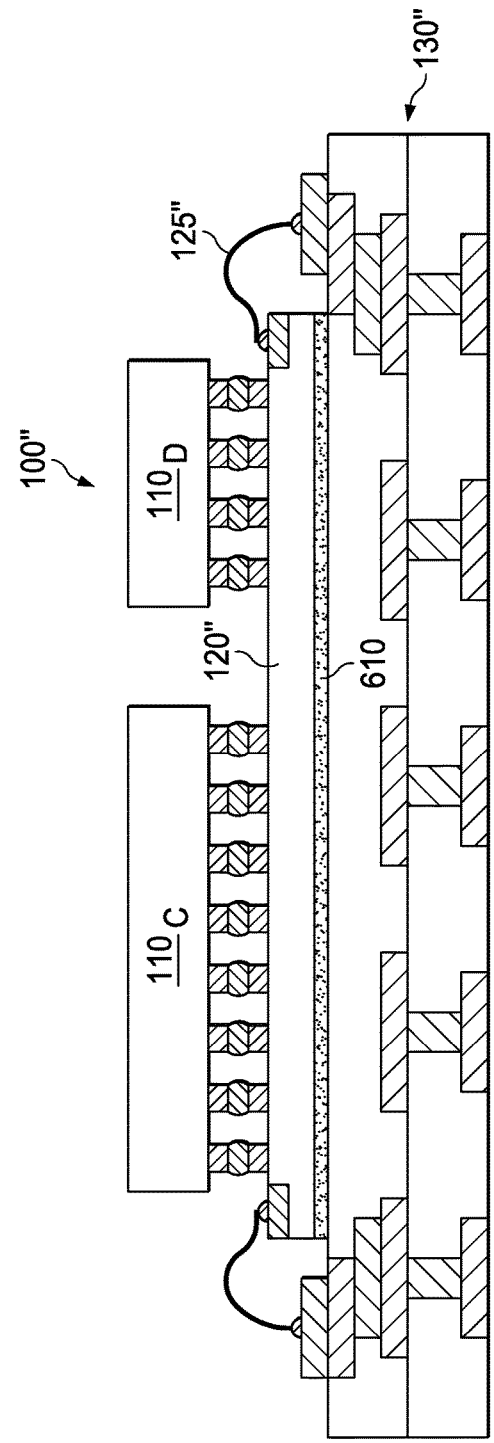

Afterwards, interconnect substrate 120" is attached to substrate 130", such as by a glue layer (not shown), as mentioned above. In addition, electrical connection is made between interconnect substrate 120" and substrate 130". FIG. 7C shows that the electrical connection is made by wire bonds 125", in accordance with some embodiments. Following making the electrical connection, a packaged die $110_D$ is placed over interconnect substrate 120" to be bonded to it, as shown in FIG. 7D in accordance with some embodiments.

Figure 7E:
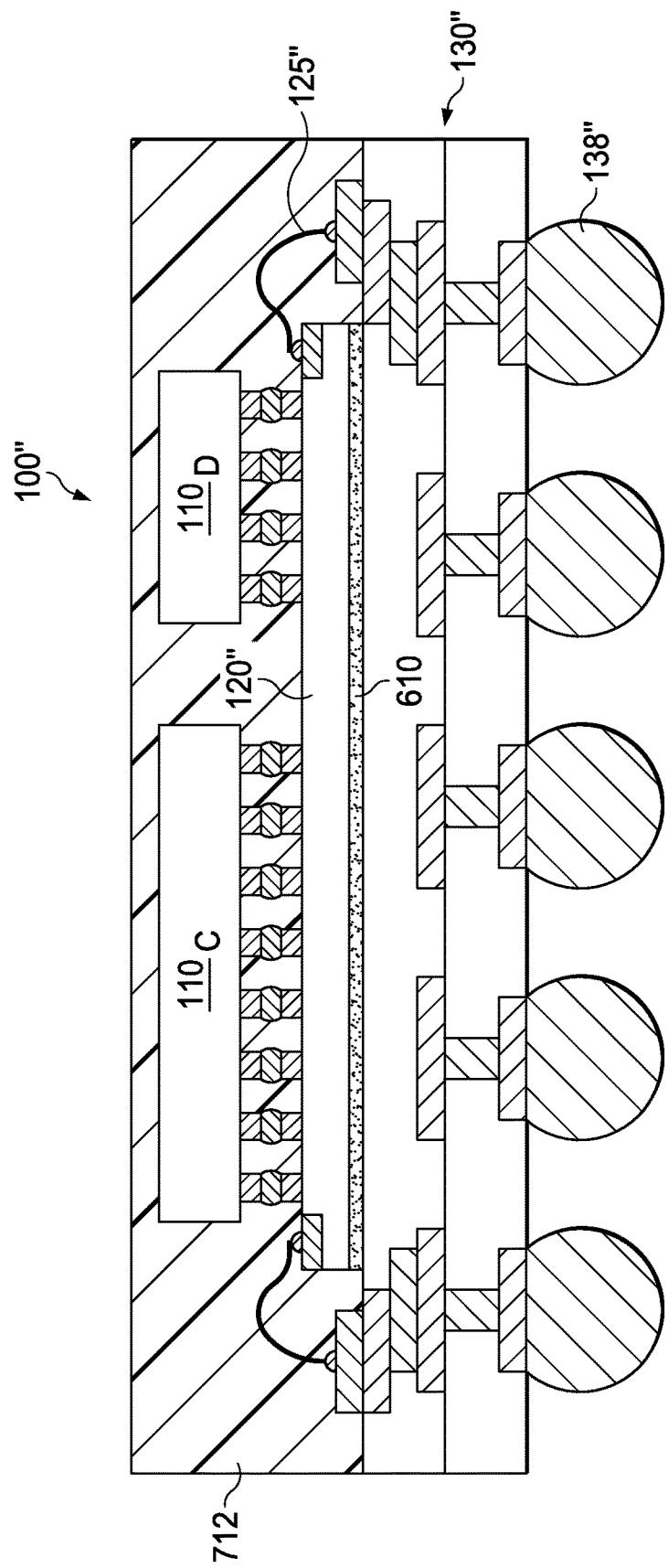

After packaged die $110_D$ is bonded to interconnect substrate 120", a molding compound 712 is formed over substrate 130" to protest packaged dies ($110_C$ and $110_D$) and substrate (120") and connecting structures (bonding structures between packaged dies and substrate 120", and wire bonds 125") over substrate 130". In some embodiments, an underfill is first formed under packaged dies $110_C$ and $110_D$ prior to forming molding compound 712. However, forming the underfill first is optional. Some molding compound materials can also act as underfill to fill the space between packaged dies $110_C/110_D$ and substrate 120". After the molding compound 812 is formed, external connectors 138" are formed on the opposite side (opposite from bonded packaged dies $110_C$ and $110_D$) to form die package 100", as shown in FIG. 7E. As mentioned above, each substrate 130" could include a number of die packages. Die packages 100" are then singulated into individual pieces. FIG. 8E shows die package 100" after it has been singulated.

The process flow described above to form die package 100" is merely one embodiment. Other process flow may also be used. For example, interconnect substrate 120" could have been placed on substrate 130" first before packaged dies $110_C$ and $110_D$ being bonded to substrate 120". Further, packaged die $110_D$ could have been bonded to interconnect substrate 120" before packaged die $110_C$. Choosing which die to bond first depends on the components on die package 100" and how these components are used. For example, packaged die $110_C$ may be bonded first because the testing of packaged die $110_D$ could require the presence of package die $110_C$. Other considerations may be needed in deciding the sequence of bonding and whether to conduct electrical testing in the sequence of forming die package 100".

Figure 8:
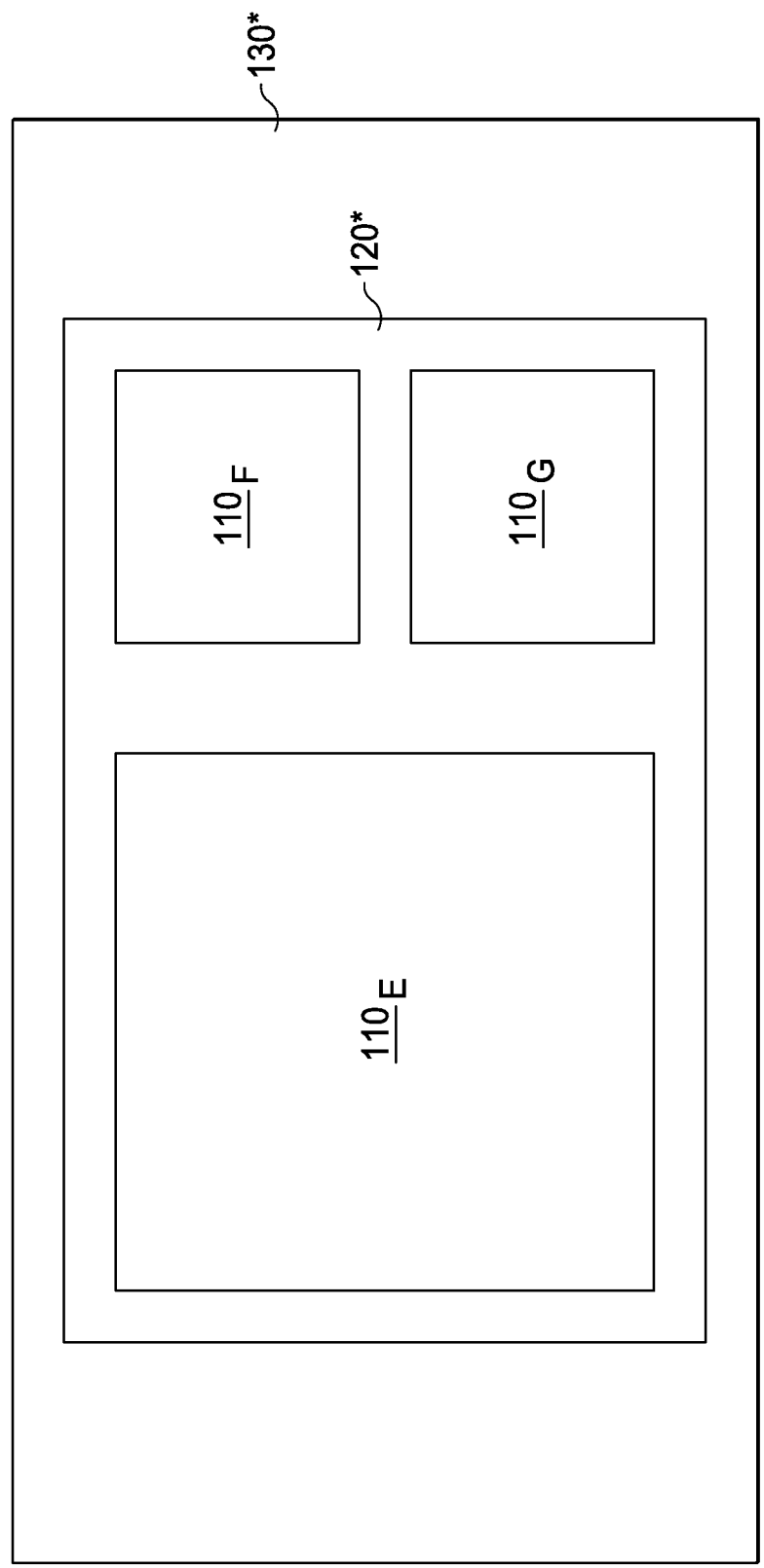
FIG. 8 shows a top view of a die package, in accordance with some embodiments.

The embodiments described above show two packaged dies bonded in each die package, such as packaged dies $110_A$ and $110_B$ on die package 100' or packaged dies $110_C$ and $110_D$ on die package 100". There could be more than two packaged dies on each die package. FIG. 8 shows a top view of a die package 100* with three packaged dies, $110_E$, $110_F$, and $110_G$, bonded an interconnect substrate 120*, which is bonded to a substrate 130*, in accordance with some embodiments. Interconnect substrate 120* is similar to interconnect 120" described above and substrate 130* is similar to substrate 130" described above. The cross-sectional view of die package 100 is similar to the cross-sectional view of die package 100" of FIG. 6. Higher number of die packages, such as 4, 5, or more, could be arranged and connected to the interconnect substrate 120 similar to substrate 120' or 120" described above and be directly or indirectly connected to a substrate similar to substrate 130' or 130" described above.

Embodiments of mechanisms for forming a die package with multiple packaged dies on a package substrate use an interconnect substrate to provide electrical connections between dies and the package substrate. The usage of the interconnect substrate enables cost reduction because it is cheaper to make than an interposer with through silicon vias (TSVs). The interconnect substrate also enables dies with different sizes of bump structures to be packaged in the same die package.

In some embodiments, a semiconductor die package is provided. The semiconductor die package includes a first packaged die, and a second packaged die. The semiconductor die package also includes an interconnect substrate with a redistribution structure. The first packaged die and the second packaged die are bonded to the redistribution structure. The semiconductor die package further includes a package substrate with an interconnect structure, the interconnect substrate is bonded to the package substrate. The package substrate is electrically connected to both the first packaged die and the second packaged die.

In some other embodiments, a method of forming a semiconductor die package is provided. The method includes bonding an interconnect substrate to a package substrate, and bonding a first packaged die to the package substrate and to the interconnect substrate. The method also includes bonding a second packaged die to the interconnect substrate. The method further includes forming a molding compound over the packaged substrate to cover the first package die and the second package die bonded to the package substrate and the interconnect substrate. In addition, the method includes forming external connectors of the package substrate.

In yet some other embodiments, a method of forming a semiconductor die package is provided. The method includes bonding a first packaged die to an interconnect substrate, and performing an electrical test after bonding the first packaged die to the interconnect substrate. The method also includes adhering the interconnect substrate to a package substrate, and making electrical connection between the interconnect substrate and the package substrate. The method further includes bonding a second packaged die to the interconnect substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor die package, comprising:
a first packaged die;
a second packaged die;
an interconnect substrate having a first side, a second side opposite the first side, and a sidewall extending between the first side and the second side, wherein the interconnect substrate comprises a redistribution structure on the first side, wherein the second side of the interconnect substrate is free from connectors, and wherein the first packaged die and the second packaged die are bonded to the first side of the redistribution structure; and
a package substrate with an interconnect structure, the package substrate having a recess, wherein the interconnect substrate is bonded to a bottom surface of the recess, wherein the second side of the interconnect substrate faces the bottom surface of the recess, wherein the sidewall of the interconnect substrate extends into the recess, wherein the sidewall of the interconnect substrate faces a sidewall of the recess, wherein the package substrate is electrically connected to the interconnect substrate using a conductive connector, wherein the conductive connector physically contacts the sidewall of the interconnect substrate and the sidewall of the recess, wherein the first packaged die and the second packaged die are electrically connected to the interconnect substrate and wherein the first packaged die is directly bonded to the package substrate.

2. The semiconductor die package of claim 1, wherein the first packaged die has a plurality of first connectors with a first width and a plurality of second connectors with a second width, and wherein the first width is larger than the second width, and wherein the plurality of first connectors are bonded to bonding structures of the package substrate, and wherein the plurality of second connectors are bonded to the interconnect substrate.

3. The semiconductor die package of claim 2, wherein the first width is in a range from about 60 µm to about 300 µm and the second width is in a range from about 10 µm to about 60 µm.

4. The semiconductor die package of claim 1, wherein the interconnect substrate has contact structures to make electrical contact with the interconnect structure of the package substrate.

5. The semiconductor die package of claim 4, wherein the contact structures are located at edges of the interconnect substrate.

6. The semiconductor die package of claim 1, wherein the first packaged die is a processing unit and the second packaged die is a memory device.

7. The semiconductor die package of claim 1, further comprising a molding compound encapsulating the first package die and the second packaged die, wherein no portion of the molding compound is interposed between the interconnect substrate and the package substrate.

8. The semiconductor die package of claim 1, wherein the second side of the interconnect substrate physically contacts a top surface of the package substrate.

9. A semiconductor die package, comprising:
a package substrate;
an interconnect substrate mounted to the package substrate, the interconnect substrate having a redistribution layer thereon, a bottom surface of the interconnect substrate physically contacting a top surface of the package substrate, the bottom surface of the interconnect substrate being free from connectors, wherein the interconnect substrate is mounted within a cavity formed in the package substrate;
an electrical connector physically contacting a sidewall of the interconnect substrate;
a first packaged die electrically bonded to the interconnect substrate through a first µ-bump connection and electrically bonded to the package substrate through a second connection other than a µ-bump connection, the second connection physically contacting the first packaged die and the package substrate; and
a second packaged die electrically bonded to the package substrate through a second µ-bump connection.

10. The semiconductor die package of claim 9, wherein the electrical connector physically contacting the sidewall of the interconnect substrate is solder ball.

11. The semiconductor die package of claim 9, wherein a topmost surface of the interconnect substrate is substantially planar with a topmost surface of the package substrate.

12. The semiconductor die package of claim 9, further comprising a molding compound encapsulating the first package die and the second packaged die, at least a portion of the molding compound extending into the cavity.

13. The semiconductor die package of claim 9, wherein the electrical connector physically contacts a sidewall of the cavity, and wherein the sidewall of the cavity faces the sidewall of the interconnect substrate.

14. The semiconductor die package of claim 9, wherein the sidewall of the cavity is spaced apart from the sidewall of the interconnect substrate.

15. A packaged device comprising:
   a package substrate;
   an interconnect substrate mounted to the package substrate and electrically connected to the package substrate by an interconnect connection, a bottom surface of the interconnect substrate facing a top surface of the package substrate, and the interconnect connection physically contacting a sidewall of the interconnect substrate;
   a first packaged die electrically connected to the interconnect substrate by at least one µ-bump connection and directly bonded to the package substrate by at least one other connection;
   a second packaged die, adjacent the first packaged die, electrically connected to the interconnect substrate by at least one µ-bump connection; and
   a molding compound encapsulating the first packaged die and the second packaged die and encapsulating the interconnect connection.

16. The packaged device of claim 15, wherein the at least one other connection is not a µ-bump connection.

17. The packaged device of claim 15, wherein the interconnect substrate is mounted in an opening within the package substrate.

18. The packaged device of claim 15, wherein the bottom surface of the interconnect substrate is free from connectors.

19. The packaged device of claim 17, wherein the bottom surface of the interconnect substrate physically contacts a bottom surface of the opening.

20. The packaged device of claim 17, wherein the interconnect connection physically contacts a sidewall of the opening.

* * * * *